United States Patent
Ishikawa

(10) Patent No.: US 10,048,324 B2
(45) Date of Patent: Aug. 14, 2018

(54) VOLTAGE DETECTING DEVICE AND VOLTAGE DETECTING METHOD

(71) Applicant: FUJITSU TEN LIMITED, Kobe-shi, Hyogo (JP)

(72) Inventor: Yukio Ishikawa, Kobe (JP)

(73) Assignee: FUJITSU TEN LIMITED, Kobe (JP)

( * ) Notice: Subject to any disclaimer, the term of this patent is extended or adjusted under 35 U.S.C. 154(b) by 0 days.

(21) Appl. No.: 15/391,325

(22) Filed: Dec. 27, 2016

(65) Prior Publication Data

US 2017/0219659 A1    Aug. 3, 2017

(30) Foreign Application Priority Data

Feb. 3, 2016  (JP) ................. 2016-018883

(51) Int. Cl.
*G01R 31/36* (2006.01)
*G01R 19/00* (2006.01)

(52) U.S. Cl.
CPC ....... *G01R 31/3675* (2013.01); *G01R 31/362* (2013.01); *G01R 31/3658* (2013.01); *G01R 19/0084* (2013.01); *G01R 19/0092* (2013.01)

(58) Field of Classification Search
CPC .... G01R 31/00; G01R 31/36; G01R 31/3606; G01R 31/362; G01R 31/3644; G01R 31/3648; G01R 31/3658; G01R 31/3675; G01R 31/3679; G01R 31/3682; G01R 19/00; G01R 19/0084; G01R 19/0092; G01R 27/08; H02J 7/0014; H02J 7/0021; H02J 7/0068; H02J 7/14

USPC ........... 324/425, 426, 431, 522, 713, 76.11; 320/161, 162; 702/1, 57, 63, 64
See application file for complete search history.

(56) References Cited

U.S. PATENT DOCUMENTS

| | | | | |
|---|---|---|---|---|
| 5,177,425 | A * | 1/1993 | Goto | H01M 10/441 320/130 |
| 8,860,371 | B2 * | 10/2014 | Yang | H02J 7/0024 320/113 |
| 2002/0143497 | A1 * | 10/2002 | Roser | G05B 15/02 702/182 |
| 2002/0167291 | A1 * | 11/2002 | Imai | H02J 7/0018 320/119 |
| 2005/0174711 | A1 * | 8/2005 | Nagai | H01H 71/26 361/93.1 |
| 2006/0028179 | A1 * | 2/2006 | Yudahira | G01R 19/16542 320/133 |
| 2009/0145490 | A1 * | 6/2009 | Kershisnik | E03B 7/04 137/334 |

(Continued)

FOREIGN PATENT DOCUMENTS

JP    2014-033604 A    2/2014

*Primary Examiner* — Hoai-An D Nguyen
(74) *Attorney, Agent, or Firm* — Oliff PLC

(57) ABSTRACT

There is provided a voltage detecting device. A plurality of detecting units are configured to detect voltages of a plurality of battery stacks of a battery pack having the plurality of battery stacks each having a plurality of battery cells connected, at intervals of a predetermined period, respectively. A mode switching unit is configured to perform switching between an active mode in which the detecting units detect the voltages and a standby mode in which the value of an electric current flowing in the detecting units is smaller than a predetermined value. A timing changing unit is configured to change start timings or/and finish timings of the active mode.

6 Claims, 7 Drawing Sheets

(56) References Cited

U.S. PATENT DOCUMENTS

| | | | |
|---|---|---|---|
| 2010/0214707 A1* | 8/2010 | Yun | H02J 7/0031 361/92 |
| 2015/0024242 A1* | 1/2015 | Nishiwaki | G01R 31/3627 429/90 |
| 2017/0006548 A1* | 1/2017 | Guo | H04L 69/28 |

* cited by examiner

FIG. 5

| NUMBER OF TIMES | START TIMING OF ACTIVE MODE |
|---|---|
| 1 | 0.0ms |
| 2 | 2.2ms |
| 3 | 4.7ms |

Ta1  Ta2  Ta3

VOLTAGE DETECTING DEVICE AND VOLTAGE DETECTING METHOD

CROSS-REFERENCE TO RELATED APPLICATIONS

This application is based on and claims priority from Japanese Patent Application No. 2016-018883 filed on Feb. 3, 2016.

TECHNICAL FIELD

The present invention relates to a voltage detecting device and a voltage detecting method.

BACKGROUND

In the related art, battery packs each of which is configured by connecting battery stacks each having a plurality of battery cells are used, for example, as power sources for electric vehicles, hybrid type vehicles, and the like. A battery pack is connected to a device for monitoring the corresponding battery pack. This device detects the voltages of the battery stacks of the battery pack, and discharges the battery stacks on the basis of the detected voltages, thereby adjusting the capacity balance of the corresponding battery stacks (see Patent Document 1).

Patent Document 1: Japanese Patent Application Publication No. 2014-33604A

However, the device of the related art does not take the temperature of the device into consideration. Therefore, if the temperature of the device rises, for example, due to the temperature of the surrounding environment or heat generation of the device, for example, there is a possibility that the rise in the temperature will break the device, thereby making it impossible to detect the voltages of the battery stacks.

SUMMARY

It is therefore an object of the present invention to provide a voltage detecting device and a voltage detecting method capable of suppressing a rise in temperature.

According to an aspect of the embodiments of the present invention, there is provided a voltage detecting device including a plurality of detecting units, a mode switching unit, and a timing changing unit. The plurality of detecting units detects voltages of a plurality of battery stacks of a battery pack having the plurality of battery stacks each having a plurality of battery cells connected, at intervals of a predetermined period, respectively. The mode switching unit performs switching between an active mode in which the detecting units detect the voltages and a standby mode in which the value of an electric current flowing in the detecting units is smaller than a predetermined value. The timing changing unit changes start timings or/and finish timings of the active mode.

According to the above aspect, it is possible to provide a voltage detecting device and a voltage detecting method capable of suppressing a rise in temperature.

BRIEF DESCRIPTION OF THE DRAWINGS

Exemplary embodiments of the present invention will be described in detailed based on the following figures, wherein:

FIG. 5 is a view illustrating a table representing change candidates for the start timing according to the embodiment;

DETAILED DESCRIPTION

Hereinafter, with reference to the accompanying drawings, an embodiment of a voltage detecting device and a voltage detecting method according to the present invention will be described in detail. However, the present invention is not limited to the embodiment to be shown below.

<1. Voltage Detecting Method>

Figure 1:
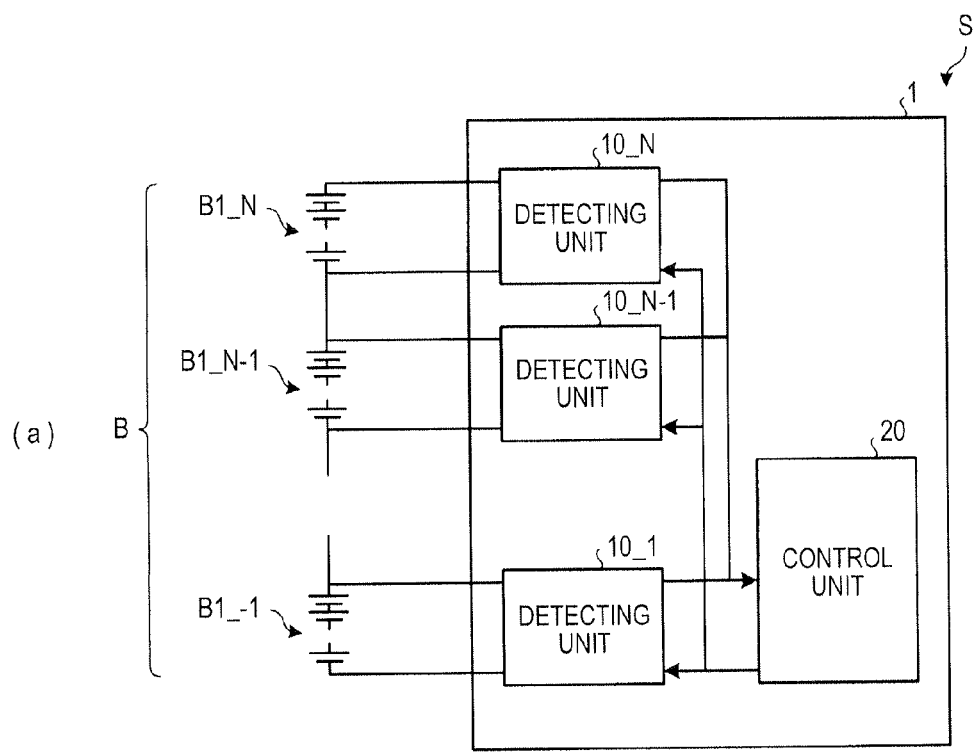
FIG. 1 is a view for explaining a voltage detecting method according to an embodiment.
Figure 1:
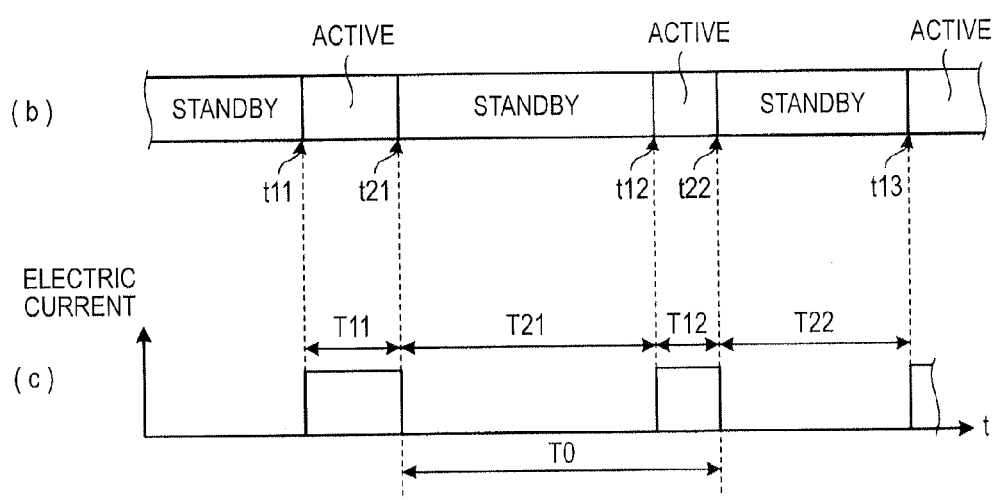

With reference to FIG. 1, a voltage detecting method according to the present embodiment will be described. FIG. 1 is a view for explaining a voltage detecting method according to the present embodiment. The voltage detecting method according to the present embodiment is a method of detecting the voltages of battery stacks $B1\_n$ (wherein "n" is a natural number between 1 and N) of a battery pack B is usable, for example, as a power source for an electric vehicle, a hybrid type vehicle, or the like. Therefore, first, the outline of a battery pack system S including the battery pack B will be described with reference to (a) of FIG. 1.

The battery pack system S of (a) of FIG. 1 includes the battery pack B and a voltage detecting device 1. The battery pack B includes the plurality of battery stacks $B1\_n$ connected in series. Each battery stack $B1\_n$ includes a plurality of battery cells connected in series.

The voltage detecting device 1 includes a plurality of detecting units 10 for detecting the voltages of the plurality of battery stacks $B1\_n$, respectively, and a control unit 20 for controlling the plurality of detecting units 10. The voltage detecting method according to the present embodiment is performed by the voltage detecting device 1.

In the voltage detecting method according to the present embodiment, the detecting units 10 of the voltage detecting device 1 detect the voltages of the battery stacks $B1\_n$ at intervals of a predetermined period T0. Also, the voltage detecting device 1 is switched between an active mode for detecting the voltages of the battery stacks $B1\_n$ and a standby mode in which the value of an electric current flowing in the detecting units 10 is smaller than a predetermined value, and operates in the switched mode.

In other words, as shown in (b) of FIG. 1, the voltage detecting device 1 detects the voltages of the battery stacks $B1\_n$ in the active mode. After detection, the voltage detecting device is switched to the standby mode and waits for the next voltage detection. Thereafter, if the voltage detecting device 1 switches from the standby mode to the active mode, it detects the voltages of the battery stacks $B1\_n$. Like this, the voltage detecting device 1 detects the voltages of the battery stacks $B1\_n$ at intervals of the predetermined period T0 by alternately switching between the active mode and the standby mode.

At this time, the voltage detecting device 1 changes start timings t11 to t13 (hereinafter, also referred to as the start timings t1) or/and finish timings t21 and t22 (hereinafter, also referred to as the finish timings t2) of the active mode.

Specifically, the voltage detecting device switches to the standby mode and the active mode for each predetermined period T0, and changes the switching timings for each predetermined period T0.

In an example shown in FIG. 1, the voltage detecting device 1 changes the start timings t1 of the active mode for each predetermined period T0. Specifically, the voltage detecting device 1 switches from the standby mode to the active mode for each predetermined period T0, and changes the timing of switching from the standby mode to the active mode (each start timing t1 of the active mode) for each predetermined period T0.

In (b) of FIG. 1, the voltage detecting device 1 changes the start timing t12 of the active mode such that the start timing t12 becomes later than the start timing t11. Therefore, in (b) of FIG. 1, an active mode period T12 becomes shorter than an active mode period T11.

As described above, in the voltage detecting method according to the present embodiment, the voltage detecting device 1 alternately switches between the active mode and the standby mode, and operates in the switched mode. For this reason, as shown in (c) of FIG. 1, in active mode periods T11 and T12 for detecting the voltages of the battery stacks B1_n, the value of the electric current flowing in the detecting units 10 becomes a predetermined value or more, and in standby mode periods T21 and T22 when the voltages are not detected, the value of the electric current flowing in the detecting units 10 becomes smaller than the predetermined value. Also, in (c) of FIG. 1, the predetermined velocity is 0 A. In other words, it is assumed that, in the standby mode, an electric current rarely flows.

In this case, as compared to a case where an electric current continues to flow in the detecting units 10, it is possible to reduce the amount of electric current which flows in the detecting units 10, and it is possible to suppress heat from being generated by the electric current flowing in the detecting units 10.

Now, a case of changing the start timings t1 or/and finish timings t2 of the active mode in the voltage detecting method according to the present embodiment will be described. It is assumed that either the start timings t1 or the finish timings t2 are not changed. In this case, an active mode period having, for example, a predetermined length repeatedly starts at intervals of a predetermined period. In other words, a large amount of electric current flows in the detecting units 10 at intervals of the predetermined period, and the electric current causes periodic noise.

For this reason, in the voltage detecting method according to the present embodiment, the start timings t1 or/and finish timings t2 of the active mode are changed, such that the active mode does not occur in predetermined periods. In this case, a large amount of electric current does not flow in the detecting units 10 in the predetermined periods, whereby it is possible to suppress periodic noise from being caused by such an electric current.

As described above, in the voltage detecting method according to the present embodiment, it is possible to suppress heat generation of the detecting units 10 while suppressing periodic noise by alternately switching the voltage detecting device between the active mode and the standby mode while changing the start timings t1 or/and finish timings t2 of the active mode. As a result, it is possible to suppress a rise in the temperature of the voltage detecting device 1. Hereinafter, the battery pack system S including the voltage detecting device 1 will be further described.

<2. Battery Pack System S>

Figure 2:
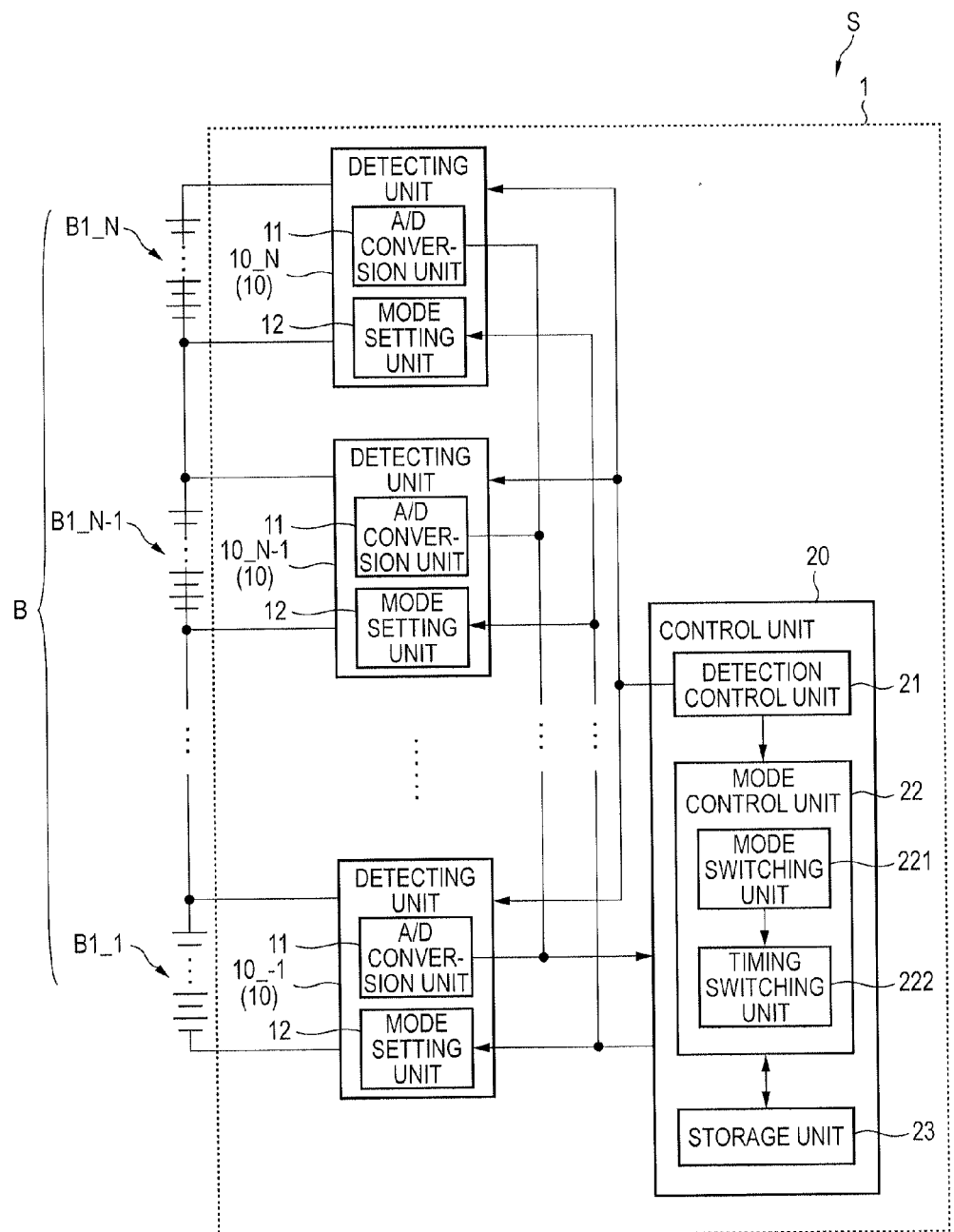
FIG. 2 is a view illustrating a configuration example of a battery pack system according to the embodiment.

FIG. 2 is a view illustrating a configuration example of the battery pack system S according to the present embodiment. The battery pack system S shown in FIG. 2 includes the battery pack B, and the voltage detecting device 1 for detecting the voltages of the battery stacks B1_n of the battery pack B.

<2.1. Battery Pack B>

The battery pack B includes the plurality of battery stacks B1_n (wherein n is a natural number between 1 and N and which will also be hereinafter referred to as the battery stacks B1) connected in series by connection members. Each of the plurality of battery stacks B1_n includes a plurality of battery cells connected in series.

<2.2. Voltage Detecting Device 1>

The voltage detecting device 1 includes the plurality of detecting units 10_n (hereinafter, also referred to as the detecting units 10) for detecting the voltages of the battery stacks B1_n, respectively, and the control unit 20 for controlling the detecting units 10.

<2.2.1. Detecting Units 10_n>

The plurality of detecting units 10_n detects the voltages of the plurality of battery stacks B1_n at intervals of the predetermined period T0, respectively. Also, the individual detecting units 10_n have the same configuration and perform the same operation. For example, the detecting units 10_n are connected to the battery stacks B1_n in parallel. Each of the plurality of detecting units 10_n includes, for example, an A/D conversion unit 11 and a mode setting unit 12.

<2.2.1.1. A/D Conversion Units 11>

The A/D conversion units 11 convert the voltages of the battery stacks B1 into digital signals, and outputs the digital signals to the control unit 20. In a case where the detecting units 10 detect the voltages of the battery stacks B1 in a so-called flying capacitor manner, for example, using capacitors (not shown in the drawings), each A/D conversion unit 11 performs A/D conversion, for example, on the voltage between both ends of a corresponding capacitor, and outputs the conversion result to the control unit 20.

Also, the detecting units 10 detect the voltages of the battery stacks B1 on the basis of instructions from the control unit 20, at intervals of the predetermined period T0. Specifically, the A/D conversion units 11 perform A/D conversion on the voltages of the battery stacks B1_n at intervals of the predetermined period T0 on the basis of instructions from the control unit 20, thereby detecting the voltages of the battery stacks B1 at intervals of the predetermined period T0.

Alternatively, the detecting units 10 may be configured to include, for example, timers, and detect the voltages of the battery stacks B1 at intervals of the predetermined period T0 on the basis of those timers. In other words, on the basis of the timers, the A/D conversion units 11 may perform A/D conversion on the voltages of the battery stacks B1 at intervals of the predetermined period T0, and output the conversion results to the control unit 20.

<2.2.1.2. Mode Setting Units 12>

The mode setting units 12 set the operating modes of the detecting units 10 to the standby mode or the active mode on the basis of instructions from the control unit 20. In a case where the mode setting units 12 set the operating modes to the active mode, for example, the detecting units 10 supply an electric current to the A/D conversion units 11, such that it becomes possible to detect the voltages of the battery stacks B1. In this case, an electric current having a value equal to or larger than the predetermined value flows in the detecting units 10. Meanwhile, in a case where the mode setting units 12 set the operating modes to the standby mode, for example, the detecting units 10 stop supply of the electric current to the A/D conversion units 11, such that the value of the electric current flowing in the detecting unit 10 becomes smaller than the predetermined value.

<2.2.2. Control Unit 20>

The control unit 20 controls the detecting units 10, thereby detecting the voltages of the battery stacks B1 at intervals of the predetermined period T0. Also, the control unit 20 controls the operating modes of the detecting units 10 such that they become the standby mode or the active mode. The control unit 20 includes a detection control unit 21, a mode control unit 22, and a storage unit 23.

<2.2.2.1. Detection Control Unit 21>

The detection control unit 21 controls the detecting units 10 such that they detect the voltages of the battery stacks B1 at intervals of the predetermined period T0. As shown in (a) of FIG. 3, the detection control unit 21 generates a detection control signal S1 at intervals of the predetermined period T0, and outputs the detection control signal to the detecting units 10.

Figure 3:
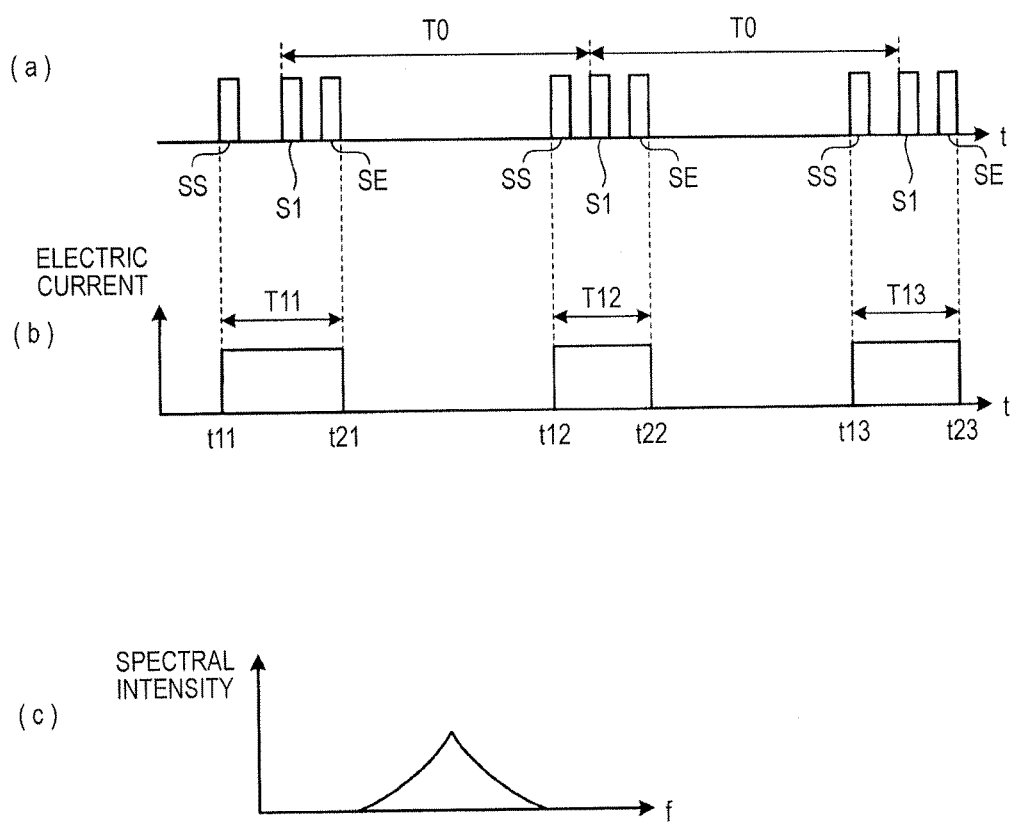
FIG. 3 is a view for explaining operating modes of a detecting unit according to the embodiment.

If receiving the detection control signal S1, the detecting units 10 performs A/D conversion on the voltages of the battery stacks B1 by the A/D conversion units 11, and output the conversion results to the control unit 20. In this way, the detecting units 10 detect the voltages of the battery stacks B1 at intervals of the predetermined period T0. Also, the detection control unit 21 outputs the detection control signal S1 to the mode control unit 22. Also, (a) of FIG. 3 is a view illustrating an example of a control signal which is generated by the control unit 20.

<2.2.2.2. Mode Control Unit 22>

The mode control unit 22 of FIG. 2 performs control such that the detecting units 10 operate in any one of the standby mode and the active mode. The mode control unit 22 changes the start timings t1 or/and finish timings t2 of the active mode. Now, a case of changing the start timings t1 of the active mode will be described. The mode control unit 22 includes a mode switching unit 221 and a timing switching unit 222.

The mode switching unit 221 switches the operating modes of the detecting units 10 between the active mode and the standby mode. For example, if receiving the detection control signal S1 from the detection control unit 21, when a predetermined period elapses from the reception, the mode switching unit 221 switches the operating modes of the detecting units 10 from the active mode to the standby mode.

Specifically, as shown in (a) of FIG. 3, the mode switching unit 221 generates the detection control signal S1. Then, when a predetermined period elapses, the detection control unit generates an active finish signal SE, and outputs the active finish signal to the mode setting units 12 of the detecting units 10. If receiving the active finish signal SE, the mode setting units 12 switch the operating modes of the detecting units 10 from the active mode to the standby mode.

Also, the mode switching unit 221 switches the operating modes of the detecting units 10 from the standby mode to the active mode at each start timing t1 changed by the timing switching unit 222. Specifically, if receiving a changed start timing t1 from the timing switching unit 222, the mode switching unit 221 generates an active start signal SS at that start timing t1, and outputs the active start signal to the mode setting units 12. If receiving the active start signal SS, the mode setting units 12 switch the operating modes of the detecting unit 10 from the standby mode to the active mode.

The timing switching unit 222 changes the start timings t1 or/and finish timings t2 of the active mode. For example, the timing switching unit 222 changes the start timings t1 of the active mode such that the lengths of the active mode periods T11 to T13 (hereinafter, also referred to as the lengths of the active mode periods T1) do not exceed a predetermined upper limit value. The upper limit value is determined, for example, on the basis of the amount of heat which the detecting units 10 generate due to the electric current flowing in the detecting units 10.

For example, in a case where the battery pack system S is mounted on a hybrid vehicle, the voltage detecting device 1 is likely to be disposed close to an engine. In this case, due to the influence of the engine, the ambient temperature of the voltage detecting device 1 becomes a high temperature. In this environment, if a large amount of electric current flows in the detecting units 10, the heat generation and ambient temperature of the detecting units 10 which are caused by the corresponding electric current may cause the detecting units 10 to become a too high temperature, resulting in a breakdown in the detecting units 10.

In view of this point, the timing switching unit 222 according to the present embodiment sets the upper limit value for the lengths of the active mode periods T1 such that the amount of heat which is generated by the detecting units 10 does not cause a breakdown in the detecting units 10. For example, in a case where the detecting units 10 include thermal shutdown circuits (not shown in the drawings), the timing switching unit sets the upper limit value such that those circuits do not shout down. Also, it is assumed that the upper limit value is determined in advance, for example, by experiments or the like.

Also, the timing switching unit 222 changes the start timings t1 of the active mode such that the lengths of the active mode periods T1 do not become equal to or shorter than a predetermined lower limit value. The lower limit value is determined on the basis of a time required for the detecting units 10 to detect the voltages of the battery stacks B1.

For example, in a case where the detecting units 10 have been switched from the standby mode to the active mode, a time is required for the A/D conversion units 11 of the detecting units 10 to become able to stably perform A/D conversion. For this reason, the timing switching unit 222 sets the time required for the A/D conversion units 11 to become able to stably perform A/D conversion, that is, the time required for the detecting units 10 to stably detect the voltages of the battery stacks B1, as the lower limit value for the lengths of the active mode periods T1.

The timing switching unit 222 changes the start timings t1 of the active mode such that the lengths of the active mode periods T1 vary between the upper limit value and the lower limit value described above.

Hereinafter, a case where the timing switching unit 222 changes the start timings t1 will be described with reference to FIGS. 3 and 4. Also, FIG. 3 is a view for explaining the operating modes of the detecting units 10 according to the present embodiment, and FIG. 4 is a view for explaining the operating modes of the detecting units 10 in a case where the start timings t1 are not changed.

First, with reference to FIG. 4, a case where the start timings t1 are not changed by the timing switching unit 222 will be described. However, in FIG. 4, the detection control signal S1 is not shown.

Figure 4:
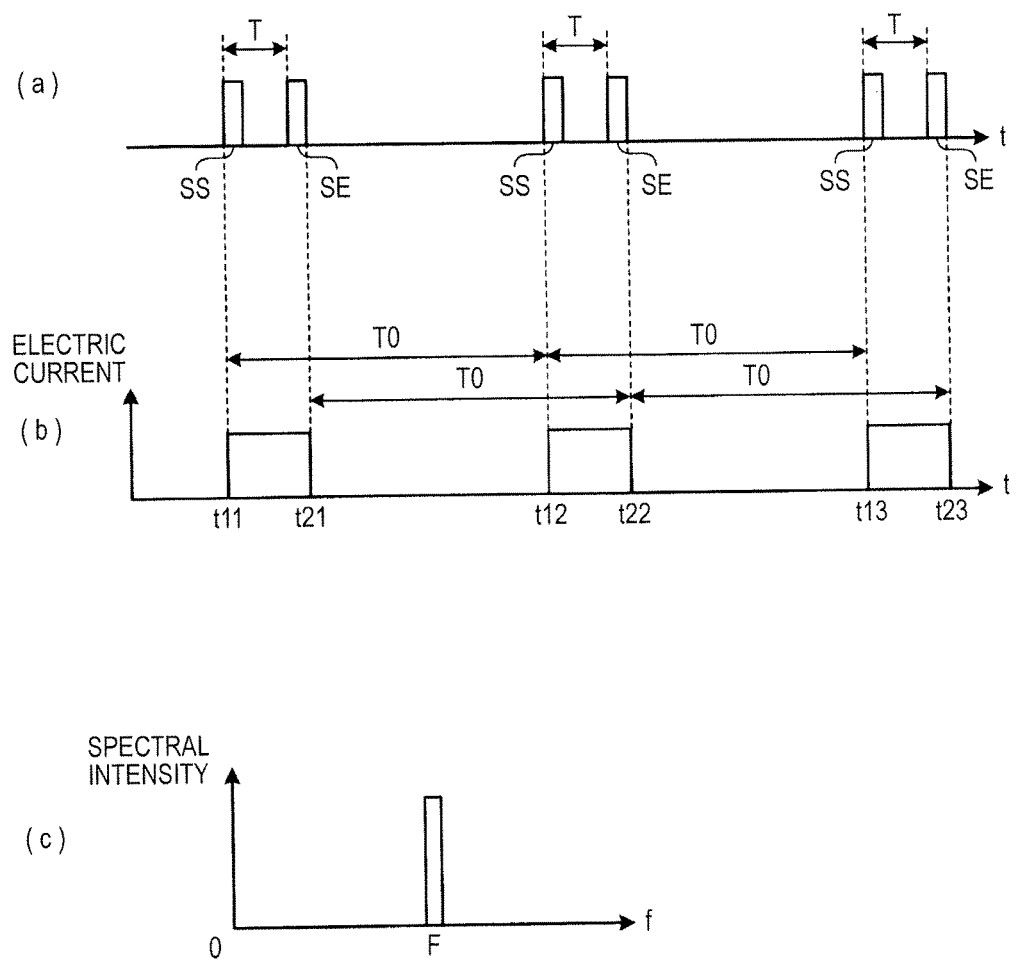
FIG. 4 is a view for explaining the operating modes of the detecting unit in a case where start timings are not changed.

As shown in (a) of FIG. 4, in a case where the start timings t1 are not changed, the mode switch unit 221 generates an active start signal SS at intervals of the predetermined period T0. Also, when a predetermined period T elapses from generation of an active start signal SS, the mode control unit 22 generates an active finish signal SE.

Therefore, the detecting units 10 repeat the active mode at intervals of the predetermined period T0. As a result, for example, as shown in (b) of FIG. 4, a pulse electric current having risings and fallings at intervals of the predetermined period T0 flows in the detecting units 10. As described above, if the pulse electric current flows in the detecting units 10 at intervals of the predetermined period T0, as shown in (c) of FIG. 4, periodic noise having a peak at a frequency F based on the predetermined period T0 occurs.

Meanwhile, if the start timings of the active mode are changed such that the lengths of the active mode periods T1 vary between the upper limit value and the lower limit value described above, as shown in (b) of FIG. 3, the timings of risings of the electric current flowing in the detecting units 10 vary. For this reason, as shown in (c) of FIG. 3, noise which is caused by that electric current has a frequency distribution having a frequency band wider than, for example, that in the case of (c) of FIG. 4. By changing the start timings of the active mode as described above, it is possible to suppress occurrence of periodic noise.

Now, with reference to FIG. 5, a specific method by which the timing switching unit 222 changes the start timings t1 will be described. FIG. 5 is a view illustrating a table Ta1 representing change candidates for the start timings t1. The table Ta1 shown in FIG. 5 is stored, for example, in the storage unit 23, and the timing switching unit 222 changes the start timings t1 on the basis of the change candidates defined in the table Ta1.

As shown in FIG. 5, in the table Ta1, the numbers of times of detection on the voltages of the battery stacks B1 and the change candidates for the start timings t1 of the active mode are associated with each other. If the control unit 20 starts to detect the voltage of the battery stacks B1 at intervals of the predetermined period T0, the timing switching unit 222 determines the next timing t1 to start the active mode according to the number of times of voltage detection on the basis of the table Ta1. Also, in FIG. 5, an elapsed time from when detection on the voltages of the battery stacks B1 starts to when the active mode starts is shown by a start timing t1 of the active mode.

Specifically, in a case where the control unit 20 has performed voltage detection twice, the timing switching unit 222 changes the next timing t1 to start the active mode to a timing "4.7 nm" corresponding to a case where the number of times is 3, and outputs the changed start timing t1 to the mode switch unit 221.

Also, it is assumed that the change candidates for the start timings t1 shown in the table Ta1 are determined in advance such that the start timings t1 vary on the basis of the upper limit value and the lower limit value described above. By changing the start timings t1 on the basis of the predetermined change candidates for the start timings t1 as described above, it is possible to change the start timings t1 of the active mode while reducing the processing load of the timing switching unit 222.

Also, as shown in FIG. 5, in the storage unit 23, a plurality of tables Ta1 to Ta3 may be stored. In this case, the timing switching unit 222 selects one table from the plurality of tables Ta1 to Ta3, and changes the start timings t1 of the active mode. Alternatively, for example, besides the case where the detecting units 10 detect the voltages of the battery stacks B1, in a case of performing a plurality of processes such as charging and discharging of the battery stacks B1, for each process, one of the tables Ta1 to Ta3 may be selected.

<2.2.2.3. Storage Unit 23>

The storage unit 23 stores information necessary for processes to be performed by the individual units of the control unit 20, such as the table Ta1. Also, the storage unit 23 stores information necessary for the individual units of the control unit 20. The storage unit 23 is a storage device, for example, a random access memory (RAM), a semiconductor memory device such as a flash memory, a hard disk, or an optical disk.

<3. Voltage Detecting Process>

Figure 6:
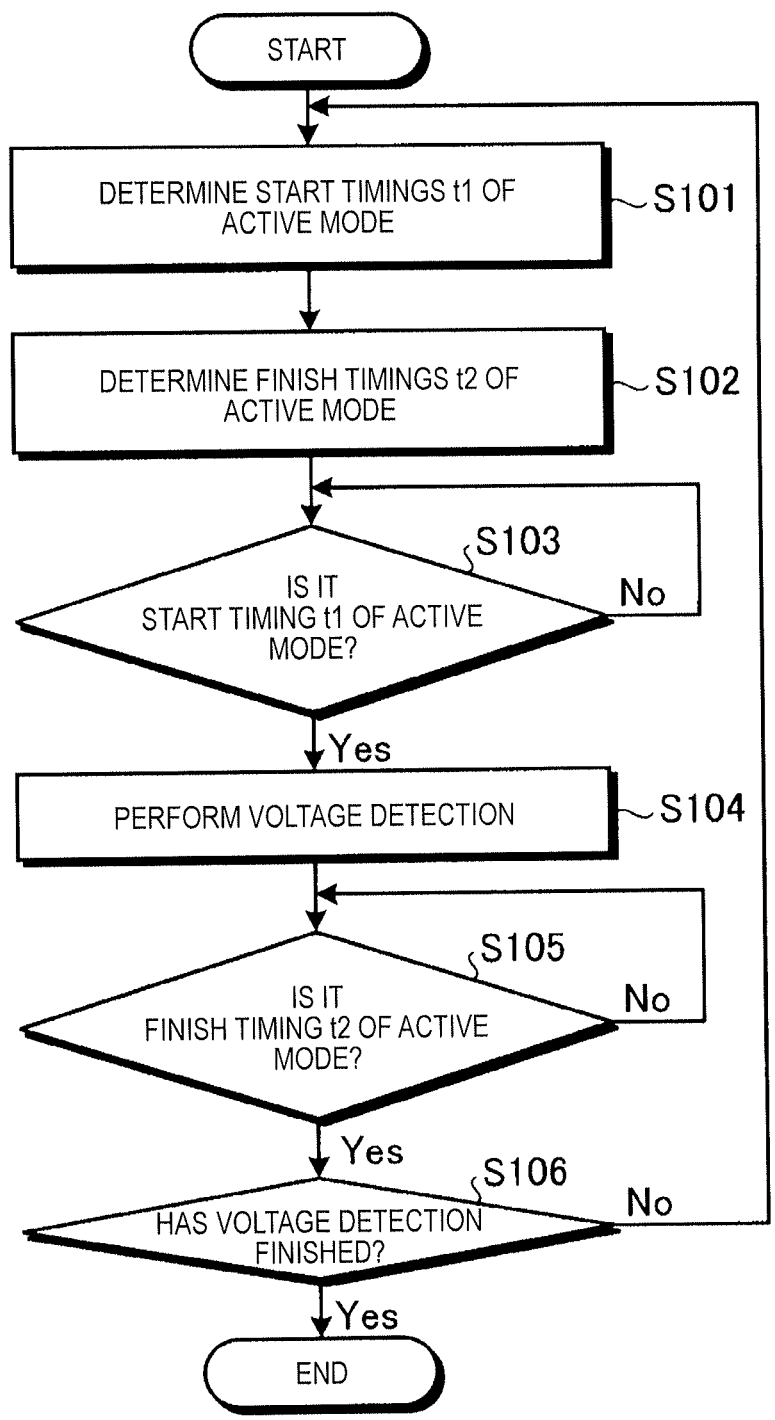
FIG. 6 is a flow chart illustrating a voltage detecting process according to the embodiment.

With reference to FIG. 6, the voltage detecting process which is performed by the voltage detecting device 1 will be described. FIG. 6 is a flow chart illustrating the voltage detecting process according to the present embodiment.

First, in STEP S101, the voltage detecting device 1 determines the start timings t1 of the active mode on the basis of the table Ta1 shown in FIG. 5. Also, in STEP S102, the voltage detecting device 1 determines the finish timings t2 of the active mode on the basis of timings to perform A/D conversion.

Subsequently, in STEP S103, the voltage detecting device 1 determines whether it is a start timing t1 of the active mode. In a case where it is not a start timing t1 of the active mode ("No" in STEP S103), the voltage detecting device returns to STEP S103, and waits for a start timing t1.

Meanwhile, in a case where it is a start timing t1 ("Yes" in STEP S103), in STEP S104, the voltage detecting device 1 detects the voltages of the battery stacks B1. Subsequently, in STEP S105, the voltage detecting device 1 determines whether it is a finish timing t2 of the active mode. In a case where it is not a finish timing t2 ("No" in STEP S105), the voltage detecting device returns to STEP S105, and waits for a finish timing t2.

In a case where it is a finish timing t2 ("Yes" in STEP S105), in STEP S106, the voltage detecting device determines whether detection on the voltages of the battery stacks B1 has finished. In a case where voltage detection has not finished ("No" in STEP S106), the voltage detecting device returns to STEP S101. In a case where voltage detection has finished ("Yes" in STEP S106), the voltage detecting device finishes the process.

Also, the order of STEP S101 and STEP S102 may be reversed, or STEP S101 and STEP S102 may be performed at the same time. Also, STEP S102 may be performed after STEP S103 or STEP S104, or may be performed at the same time as STEP S103 and STEP S104.

<4. Application Examples of Charging/Discharging System>

Figure 7:
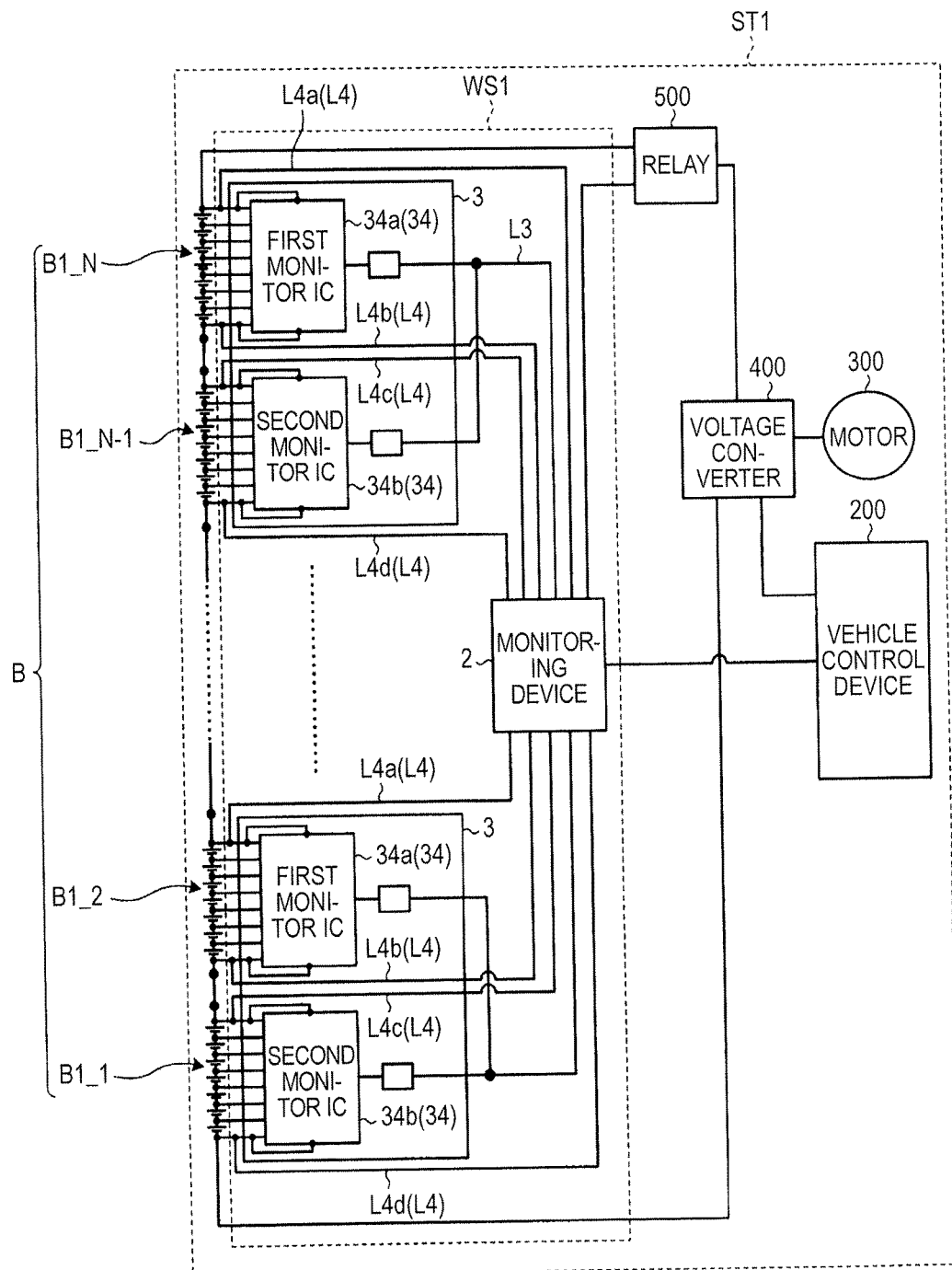
FIG. 7 is a view illustrating the outline of a charging/discharging system.

Now, with reference to FIG. 7, a case of applying the battery pack system S shown in FIG. 2 to a charging/discharging system ST1 will be described. FIG. 7 is a view illustrating the outline of the charging/discharging system ST1. The charging/discharging system ST1 shown in FIG. 7 can be used as a power source for driving a vehicle such as a hybrid electric vehicle (HEV), an electric vehicle (EV), or a fuel cell vehicle (FCV).

The charging/discharging system ST1 is a system including the battery pack B, a battery monitoring system WS1, a vehicle control device 200, a motor 300, a voltage converter 400, and a relay 500. Also, the battery monitoring system WS1 is a system including a plurality of satellite boards 3 having monitor ICs 34 and so on, and a monitoring device 2. Also, the battery pack B and the battery monitoring system WS1 included in the charging/discharging system ST1 correspond to the battery pack system S shown in FIG. 2, and the battery monitoring system WS1 corresponds to the voltage detecting device 1.

The battery pack B of FIG. 7 is a battery which is insulated from the body of a vehicle, and is configured by a plurality of blocks. In each block, sixteen battery cells are connected in series. The sixteen battery cells of each block are connected to monitor ICs 34 installed on one corresponding satellite board 3. Therefore, the voltages of the individual battery cells of each block can be measured by monitor ICs 34 installed in a corresponding satellite board 3.

Also, each satellite board 3 has two monitor ICs, that is, a first monitor IC 34a and a second monitor IC 34b installed thereon, such that the first monitor IC 34a and the second monitor IC 34b take charge of two battery cell groups of a corresponding block, respectively, wherein each group is composed of eight battery cells. Also, each battery cell group composed of eight cells corresponds to a battery stack B1 of FIG. 2. Also, the first monitor ICs 34a and the second monitor ICs 34b correspond to the individual detecting units 10 of FIG. 2, respectively.

The monitoring device 2 monitors the voltage of each battery stack B1 while monitoring the voltage of each of the plurality of battery cells. In other words, the monitoring device monitors the charged state of the battery pack B. Specifically, the monitor ICs 34 measure the voltages of the individual battery cells (hereinafter, also referred to as the cell voltages), on the basis of voltage measurement requests received from the monitoring device 2 through communication lines L3, and transmit the measurement results to the monitoring device 2 through the communication lines L3.

The monitoring device 2 receives the cell voltages from the monitor ICs 34 and performs charging with the voltages of the battery stacks B1 (hereinafter, referred to as the "stack voltages") through communication lines L4, thereby directly measuring the stack voltages and monitoring the charged state. As described above, the monitoring device 2 operates as a monitoring device for monitoring the charged state of the battery pack B, and also operates as a control unit for controlling detection on the stack voltages. In other words, the monitoring device 2 corresponds to the control unit 20 of FIG. 2.

The monitoring device 2 also operates as a determining device for determining whether each monitor IC 34 operates normally. For example, the monitoring device 2 adds the voltages of individual battery cells received from each monitor IC 34, and compares the sum with a directly detected stack voltage. In a case where the difference between them is larger than an allowable value, the monitoring device determines that the corresponding monitor IC 34 is abnormal. In a case of determining that a monitor IC 34 is abnormal, the monitoring device 2 performs a fail-safe function.

The vehicle control device 200 performs charging and discharging on the battery pack B in response to the charged state of the battery pack B. Specifically, in a case where the battery pack B is in an over-charge state, the vehicle control device 200 converts the DC voltage of the charged battery pack B into an AC voltage by the voltage converter 400, and drives the motor 300. As a result, the battery pack B is discharged.

Also, in a case where the battery pack B is in an over-discharge state, the vehicle control device 200 converts the AC voltage generated by regenerative braking of the motor 300, into a DC voltage, by the voltage converter 400. As a result, the battery pack B is charged with the voltage. As described above, the vehicle control device 200 monitors the voltage of the battery pack B on the basis of the charged state of the battery pack B acquired from the monitoring device 2, and performs control according to the monitoring result.

As described above, the voltage detecting device 1 according to the present embodiment can suppress heat generation of the detecting units 10 while suppressing periodic noise by alternately performing switching between the active mode and the standby mode while changing the start timings t1 of the active mode. As a result, it is possible to suppress a rise in the temperature of the voltage detecting device 1.

Also, by applying the voltage detecting device 1 according to the present embodiment to the charging/discharging system ST1 usable as a power source for deriving a vehicle such as a hybrid electric vehicle, thereby suppressing periodic noise from being generated by the voltage detecting device 1, it is possible to suppress problems attributable to periodic noise, such as a malfunction of the charging/discharging system ST1 attributable to periodic noise. Also, by suppressing a rise in the temperature of the voltage detecting device 1, it is possible to suppress a problem that the rise in the temperature makes it impossible to detect the stack voltages, and it is possible to more surely operate the charging/discharging system ST1.

<5. Modifications>

Although the voltage detecting device 1 according to the embodiment has been described above, the voltage detecting device 1 is not limited to the above-described embodiment, and can be modified in various forms. Hereinafter, these modifications will be described. All forms including the above described embodiment and the following forms can be appropriately combined.

In the above-described embodiment, the case of changing the start timings t1 of the active mode has been described; however, the present invention is not limited thereto. Since it is only required to change the start timings t1 or/and finish timings t2 of the active mode, for example, the finish timings t2 of the active mode may be changed.

In this case, it is assumed that the storage unit 23 retains change candidates for the finish timings t2 defined on the basis of an upper limit value according to the amount of heat which is generated by the detecting units 10 and a lower limit value necessary for voltage detection, instead of the change candidates for the start timings t1, as a table Ta1.

Also, the timing switching unit 222 sets timings earlier than detection control signals S1 by a predetermined time, as the start timings t1. Also, the predetermined time is, for example, a time longer than a time required for A/D conversion of the A/D conversion units 11 to become stable in a case where switching has been performed from the standby mode to the active mode.

According to the number of times of voltage detection of the detecting units 10, the timing switching unit 222 determines the next timing t2 to finish the active mode, on the basis of the table Ta1. Also, the determining method is the same as that in the case of changing the start timings t1.

By changing the finish timings t2, instead of the start timings t1, as described above, it is possible to change the rising timings of the electric current flowing in the detecting units 10, and it is possible to suppress occurrence of periodic noise.

Alternatively, all of the start timings t1 and finish timings t2 of the active mode may be changed. In this case, for example, by fixing the lengths of the active mode periods T1 at an upper limit value according to the amount of heat which is generated by the detecting units 10 and changing the start timings t1, it is possible to change all of the start timings t1 and the finish timings t2.

Specifically, the timing switching unit 222 changes the start timings t1 of the active mode on the basis of the table Ta1 shown in FIG. 5, and changes the finish timings t2 by adding the above-described upper limit value to the changed start timings t1.

Also, although a case of fixing the lengths of the active mode periods T1 at the upper limit value has been described, the present invention is not limited thereto. The lengths of the active mode periods T1 needs only to be between a lower limit value necessary for voltage detection and the above-described upper limit value. Also, in the storage unit 23, as the table Ta1 shown in FIG. 5, change candidates for the finish timings t2 may be stored in place of the change candidates for the start timings t1.

Also, although the case of fixing the lengths of the active mode periods T1 has been described, the present invention is not limited thereto. The lengths of the active mode periods T1 may be variable between the lower limit value necessary for voltage detection and the upper limit value according to the amount of heat which is generated by the detecting units 10. For example, by storing a table representing change candidates for the start timings t1 and change candidates for the finish timings t2 in place of the table Ta1 shown in FIG. 5, it is possible to change the lengths of the active mode periods T1.

Also, although the start timings t1 are changed on the basis of the table Ta1 in the above-described embodiment, the present invention is not limited thereto. For example, the timing switching unit 222 may randomly change the start timings t1 or/and the finish timings t2, using a random function.

If the timing switching unit 222 randomly changes the start timings t1 or/and the finish timings t2 such that the start timings t1 or/and the finish timings t2 vary more randomly, it is possible to further suppress periodic noise.

Also, in the above-described embodiment, the start timings t1 or/and the finish timings t2 of the active mode are changed. This is identical to a case of changing start timings or/and finish timings of the standby mode.

In other words, since the voltage detecting device 1 according to the present embodiment alternately repeats the active mode and the standby mode, the start timings t1 of the active mode correspond to the finish timings of the standby mode, and the finish timings t2 of the active mode correspond to the start timings of the standby mode.

Also, the voltage detecting device 1 detects the voltages of the battery stacks B1 at intervals of the predetermined period T0. In other words, it repeats the active mode and the standby mode at intervals of the predetermined period T0. Therefore, the upper limit value for the lengths of the active mode periods T1 corresponds to the lower limit value for the lengths of standby mode periods, and the lower limit value for the lengths of the active mode periods T1 corresponds to the upper limit value for the lengths of the standby mode periods. Therefore, for example, the case of fixing the lengths of the active mode periods T1 is identical to a case of fixing the lengths of the standby mode periods.

Also, in the above-described embodiment, for example, the battery pack B has the plurality of battery stacks B1_$n$ connected in series; however, the battery pack B has a plurality of battery stacks B1_$n$ connected in parallel. Also, each battery stack B1_$n$ has a plurality of battery cells connected in series; however, each battery stack B1_$n$ may have a plurality of battery cells connected in parallel.

The voltage detecting device 1 according to each of the embodiment and the modifications described above includes the plurality of detecting units 10_$n$, the mode switching unit 221, and the timing switching unit 222. The plurality of detecting units 10_$n$ detects the voltages of the plurality of battery stacks B1_$n$ of the battery pack B having the plurality of battery stacks B1_$n$ each having a plurality of battery cells connected, at intervals of the predetermined period T0, respectively. The mode switching unit 221 performs switching between the active mode in which the detecting units 10 detect the voltages and the standby mode in which the value the electric current flowing in the detecting units 10 is smaller than the predetermined value. The timing switching unit 222 changes the start timings t1 or/and finish timings t2 of the active mode.

As a result, it is possible to suppress heat generation of the detecting units 10 while suppressing periodic noise, and it is possible to suppress a rise in the temperature of the voltage detecting device 1.

The timing switching unit 222 of the voltage detecting device 1 according to each of the embodiment and the modifications described above changes the start timings t1 or/and the finish timings t2, using a value determined on the basis of the amount of heat generated by the detecting units 10 due to the electric current flowing in the detecting units 10, as the upper limit value for the lengths of the active mode periods T1.

As a result, it is possible to suppress heat generation of the detecting units 10 while suppressing periodic noise, and it is possible to suppress a rise in the temperature of the voltage detecting device 1.

The timing switching unit 222 of the voltage detecting device 1 according to each of the embodiment and the modifications described above changes the start timings t1 or/and the finish timings t2, using a time required for the detecting units 10 to detect the voltages, as the lower limit value for the lengths of the active mode periods T1.

As a result, it is possible to suppress heat generation of the detecting units 10 while suppressing periodic noise, and it is possible to suppress a rise in the temperature of the voltage detecting device 1, and it is possible to more surely detect the voltages of the battery stacks B1 by the detecting units 10.

The voltage detecting device 1 according to each of the embodiment and the modifications described above further includes the storage unit 23 for storing a plurality of change candidates for the start timings t1 or/and the finish timings t2. Also, on the basis of the plurality of change candidates, the timing switching unit 222 changes the start timings t1 or/and the finish timings t2.

In this way, it is possible to change the start timings t1 or/and the finish timings t2, and it is possible to further suppress periodic noise.

The timing switching unit 222 of the voltage detecting device 1 according to each of the embodiment and the modifications described above randomly changes the start timings t1 or/and the finish timings t2.

In this way, it is possible to randomly change the start timings t1 or/and the finish timings t2, and it is possible to further suppress periodic noise.

The voltage detecting method according to each of the embodiment and the modifications described above includes a detecting process, a mode switching process, and a timing changing process. In the detecting process, the plurality of detecting units 10 detects the voltages of the plurality of battery stacks B1 of the battery pack B having the plurality of battery stacks B1 each having a plurality of battery cells connected, at intervals of a predetermined period T1, respectively. In the mode switching process, switching is performed between the active mode in which the detecting units 10 detect the voltages and the standby mode in which the value of the electric current flowing in the plurality of detecting units 10 has the predetermined value. In the timing changing process, the start timings t1 or/and finish timings t2 of the active mode are changed.

In this way, it is possible to suppressing heat generation of the detecting units 10 while suppressing periodic noise, and it is possible to suppress a rise in the temperature of the voltage detecting device 1 which performs the voltage detecting method.

Various advantages and modifications can be easily achieved by those skilled in the art. Therefore, the invention in its broader aspects is not limited to the specific details and representative embodiments shown and described above. Accordingly, various modifications may be made without departing from the spirit or scope of the general inventive concept as defined by the appended claims and their equivalents.

What is claimed is:

1. A voltage detecting device comprising:
a plurality of detecting units configured to detect voltages of a plurality of battery stacks of a battery pack having the plurality of battery stacks each having a plurality of battery cells connected, at intervals of a predetermined period, respectively;
a mode switching unit configured to perform switching between an active mode in which the detecting units detect the voltages and a standby mode in which the value of an electric current flowing in the detecting units is smaller than a predetermined value; and
a timing changing unit configured to change start timings or/and finish timings of the active mode so that a duration of the active mode varies.

2. The voltage detecting device according to claim 1, wherein the timing changing unit changes the start timings or/and the finish timings, using a value determined on the basis of the amount of heat generated by the detecting units due to the electric current flowing in the detecting units, as an upper limit value for the lengths of active mode periods.

3. The voltage detecting device according to claim 1, wherein the timing changing unit changes the start timings or/and the finish timings, using a time required for the detecting units to detect the voltages, as a lower limit value for the lengths of active mode periods.

4. The voltage detecting device according to claim 1, further comprising a storage unit configured to store a plurality of change candidates for the start timings or/and the finish timings,
wherein the timing changing unit changes the start timings or/and the finish timings on the basis of the plurality of change candidates.

5. The voltage detecting device according to claim 1, wherein the timing changing unit randomly changes the start timings or/and the finish timings.

6. A voltage detecting method comprising:
a detecting process of detecting voltages of a plurality of battery stacks of a battery pack having the plurality of battery stacks each having a plurality of battery cells connected, at intervals of a predetermined period, by a plurality of detecting units, respectively;
a mode switching process of performing switching between an active mode in which the detecting units detect the voltages and a standby mode in which the value of an electric current flowing in the plurality of detecting units is smaller than a predetermined value; and
a timing changing process of changing start timings or/and finish timings of the active mode so that a duration of the active mode varies.

* * * * *